United States Patent
Isshiki

(10) Patent No.: US 8,567,927 B2
(45) Date of Patent: Oct. 29, 2013

(54) PIEZOELECTRIC DEVICE, LIQUID-EJECTING HEAD, AND LIQUID-EJECTING APPARATUS

(75) Inventor: Tetsuya Isshiki, Shiojiri (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 13/363,501

(22) Filed: Feb. 1, 2012

(65) Prior Publication Data

US 2012/0200643 A1   Aug. 9, 2012

(30) Foreign Application Priority Data

Feb. 8, 2011  (JP) ................................. 2011-025460

(51) Int. Cl.
  *B41J 2/045* (2006.01)
  *H01L 41/04* (2006.01)
  *H01L 41/18* (2006.01)
  *H01L 41/187* (2006.01)
  *C04B 35/495* (2006.01)
  *C04B 35/00* (2006.01)

(52) U.S. Cl.
  USPC ... 347/72; 310/311; 252/62.9 R; 252/62.9 PZ

(58) Field of Classification Search
  USPC .......................................................... 347/72
  See application file for complete search history.

(56) References Cited

U.S. PATENT DOCUMENTS

2011/0006243 A1   1/2011 Sasaki et al.

FOREIGN PATENT DOCUMENTS

| JP | 2001-223404 | | 8/2001 |
| JP | 2009-252789 | | 10/2009 |
| JP | 2009-267363 | | 11/2009 |
| JP | 2010-043353 | | 2/2010 |
| JP | 2011222849 A | * | 11/2011 |

OTHER PUBLICATIONS

Machine Translation of JP2011222849A, Paragraphs 22, 43-44, and 117.*

* cited by examiner

*Primary Examiner* — Lisa M Solomon
(74) *Attorney, Agent, or Firm* — Workman Nydegger

(57) ABSTRACT

A piezoelectric device comprises a first electrode, a piezoelectric layer provided above the first electrode, and a second electrode provided above the piezoelectric layer. The piezoelectric layer comprises a mixed crystal containing at least bismuth ferrate and barium titanate. The piezoelectric layer comprises a first piezoelectric layer and a second piezoelectric layer which is disposed between at least one of the first and second electrodes and the first piezoelectric layer. The barium titanate content of the second piezoelectric layer is at least 10 mole percent higher than the barium titanate content of the first piezoelectric layer.

6 Claims, 10 Drawing Sheets ized crystallized piezoelectric material, and two electrodes between which the piezoelectric layer is disposed. This type of piezoelectric device is provided on a liquid-ejecting head, for example, as an actuator that operates in a flexural vibration mode. A typical example of a liquid-ejecting head is an ink-jet recording head including a diaphragm that defines part of a pressure-generating chamber communicating with a nozzle orifice from which ink droplets are ejected and a piezoelectric device that deforms the diaphragm to pressurize ink in the pressure-generating chamber to eject ink droplets from the nozzle orifice.

PIEZOELECTRIC DEVICE, LIQUID-EJECTING HEAD, AND LIQUID-EJECTING APPARATUS

CROSS-REFERENCE TO RELATED APPLICATIONS

The entire disclosure of Japanese Patent Application No. 2011-025460, filed Feb. 8, 2011 is expressly incorporated by reference.

BACKGROUND

1. Technical Field

The present invention relates to liquid-ejecting heads having piezoelectric devices that cause a pressure change in pressure-generating chambers communicating with nozzle orifices and that include a piezoelectric layer and electrodes that apply a voltage to the piezoelectric layer, and also relates to liquid-ejecting apparatuses and piezoelectric devices.

2. Related Art

Among piezoelectric devices is one including a piezoelectric layer (piezoelectric film) formed of a piezoelectric material having an electromechanical conversion function, for example, a crystallized piezoelectric material, and two electrodes between which the piezoelectric layer is disposed. This type of piezoelectric device is provided on a liquid-ejecting head, for example, as an actuator that operates in a flexural vibration mode. A typical example of a liquid-ejecting head is an ink-jet recording head including a diaphragm that defines part of a pressure-generating chamber communicating with a nozzle orifice from which ink droplets are ejected and a piezoelectric device that deforms the diaphragm to pressurize ink in the pressure-generating chamber to eject ink droplets from the nozzle orifice.

The piezoelectric layer included in the piezoelectric device requires the use of a piezoelectric material with high piezoelectricity, a typical example of which is lead zirconate titanate (PZT) (see JP-A-2001-223404). From the viewpoint of environmental issues, on the other hand, there is a demand for a piezoelectric material with a lower lead content. Examples of lead-free piezoelectric materials include $BiFeO_3$-based piezoelectric materials containing bismuth and iron, one specific example being a multiple oxide represented as a mixed crystal of bismuth manganate ferrate, such as $Bi(Fe,Mn)O_3$, and barium titanate, such as $BaTiO_3$ (see JP-A-2009-252789).

However, a piezoelectric layer formed of a mixed crystal of bismuth manganate ferrate and barium titanate has the problem of leakage current. This problem is not unique to liquid-ejecting heads such as ink-jet recording heads; other piezoelectric devices share the same problem.

SUMMARY

An advantage of some aspects of the invention is that it provides a liquid-ejecting head including a piezoelectric device that allows a lower leakage current to flow, a liquid-ejecting apparatus, and a piezoelectric device.

A liquid-ejecting head according to a first aspect of the invention includes a pressure-generating chamber communicating with a nozzle orifice and a piezoelectric device including a first electrode, a piezoelectric layer disposed on the first electrode, and a second electrode disposed on the piezoelectric layer. The piezoelectric layer contains a multiple oxide represented as a mixed crystal containing bismuth manganate ferrate and barium titanate. The piezoelectric layer includes a first piezoelectric layer and a second piezoelectric layer which is disposed between at least one of the first and second electrodes and the first piezoelectric layer and whose barium titanate content is at least 10 mole percent higher than the barium titanate content of the first piezoelectric layer.

According to the first aspect, because the piezoelectric layer contains a multiple oxide represented as a mixed crystal containing bismuth manganate ferrate and barium titanate and includes the first piezoelectric layer and the second piezoelectric layer, which is disposed between at least one of the first and second electrodes and the first piezoelectric layer and whose barium titanate content is at least 10 mole percent higher than the barium titanate content of the first piezoelectric layer, the piezoelectric layer allows a lower leakage current to flow.

It is preferable that the second piezoelectric layer be disposed between the first electrode and the first piezoelectric layer and between the second electrode and the first piezoelectric layer. In this case, the piezoelectric layer allows a still lower leakage current to flow.

It is preferable that the second piezoelectric layer have a thickness of 100 nm or more. In this case, the piezoelectric layer allows a lower leakage current to flow and has a higher breakdown voltage.

The first piezoelectric layer may contain a multiple oxide represented as a mixed crystal having formula (1), and the second piezoelectric layer may contain a multiple oxide represented as a mixed crystal having formula (2):

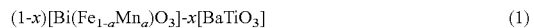  (1)

(wherein 0<x<0.40 and 0.01<a<0.10)

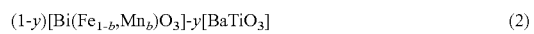  (2)

(wherein x+0.10≤y<1 and 0.01<b<0.10)

In this case, with the first piezoelectric layer containing a multiple oxide represented as a mixed crystal having formula (1) and the second piezoelectric layer containing a multiple oxide represented as a mixed crystal having formula (2), a liquid-ejecting head including a piezoelectric device that allows a lower leakage current to flow is provided.

A liquid-ejecting apparatus according to a second aspect of the invention includes the liquid-ejecting head described above. According to the second aspect, a highly reliable liquid-ejecting apparatus is provided because it includes a piezoelectric device that allows a lower leakage current to flow.

A piezoelectric device according to a third aspect of the invention includes a first electrode, a piezoelectric layer disposed on the first electrode, and a second electrode disposed on the piezoelectric layer. The piezoelectric layer contains a multiple oxide represented as a mixed crystal containing bismuth manganate ferrate and barium titanate. The piezoelectric layer includes a first piezoelectric layer and a second piezoelectric layer which is disposed between at least one of the first and second electrodes and the first piezoelectric layer and whose barium titanate content is at least 10 mole percent higher than the barium titanate content of the first piezoelectric layer. According to the third aspect, because the piezoelectric layer contains a multiple oxide represented as a mixed crystal containing bismuth manganate ferrate and barium titanate and includes the first piezoelectric layer and the second piezoelectric layer, which is disposed between at least one of the first and second electrodes and the first piezoelectric layer and whose barium titanate content is at least 10 mole percent higher than the barium titanate content of the first piezoelectric layer, the piezoelectric layer allows a lower leakage current to flow.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
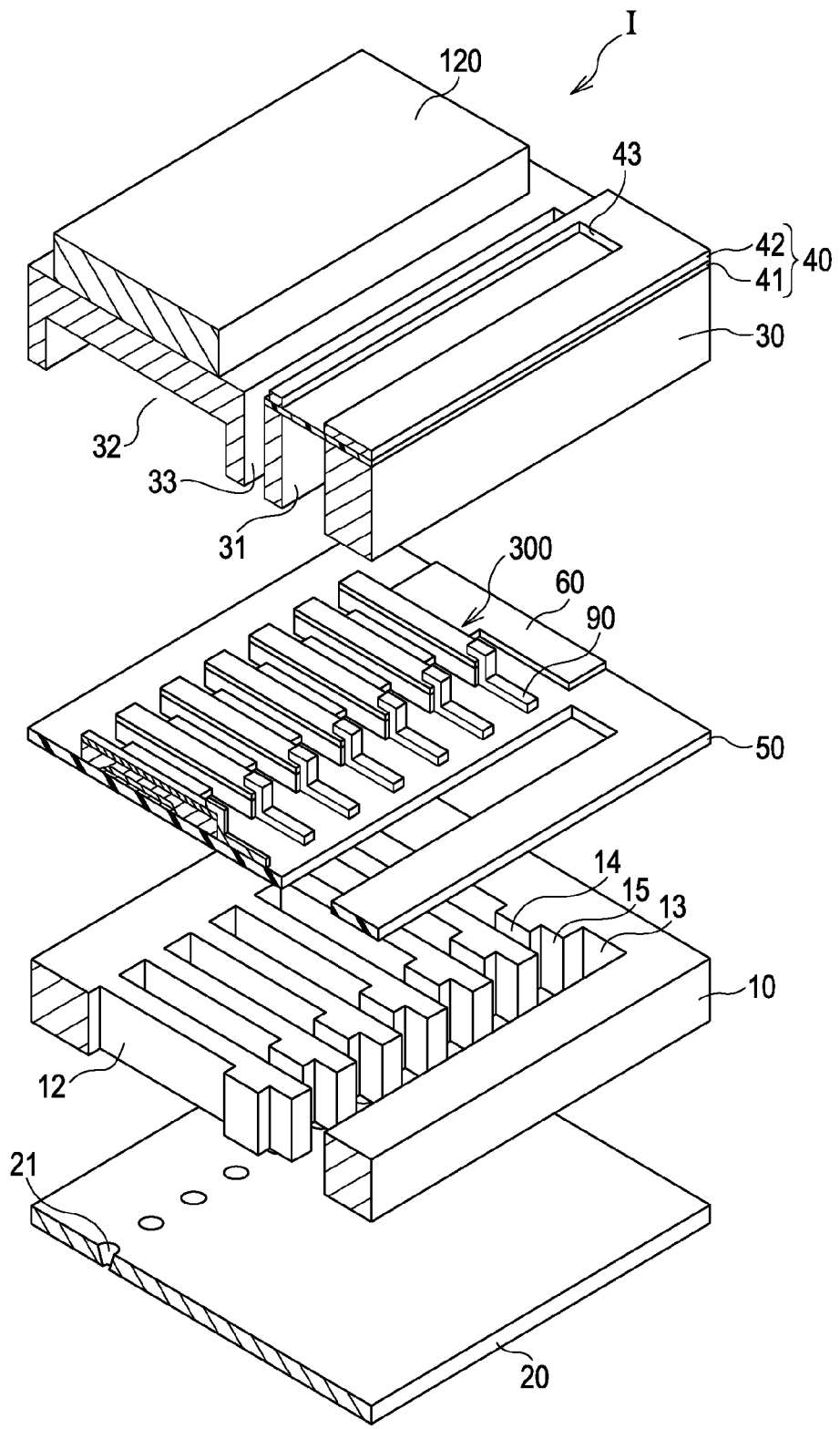
FIG. 1 is an exploded perspective view schematically showing the structure of a recording head according to a first embodiment of the invention.
Figure 2:
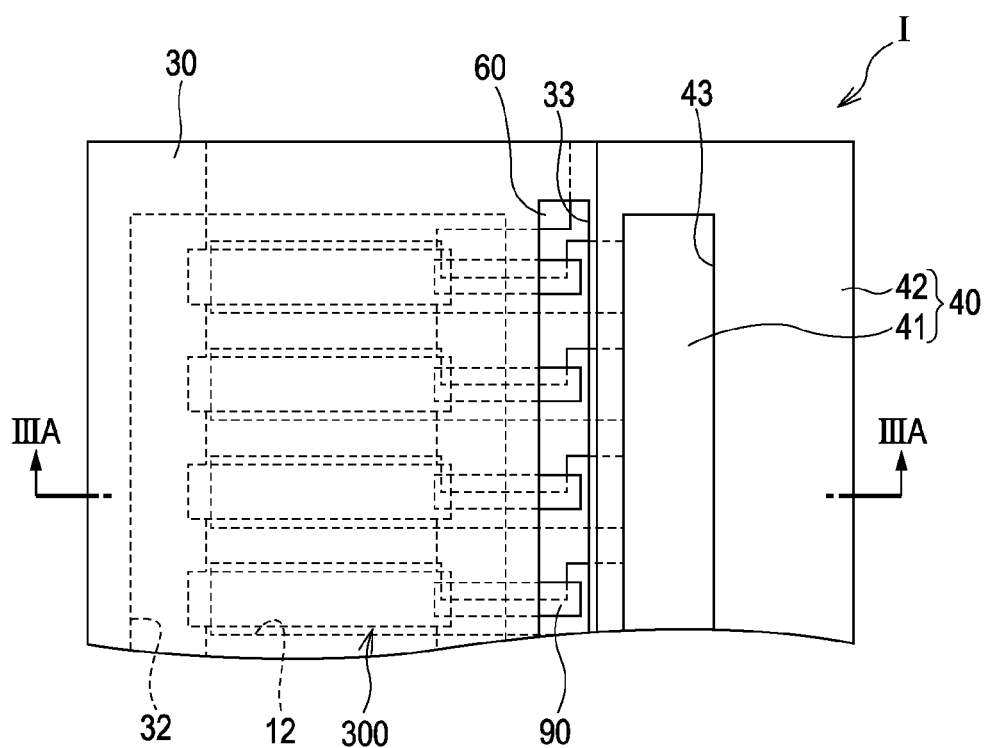
FIG. 2 is a plan view of the recording head according to the first embodiment.
Figure 3A:
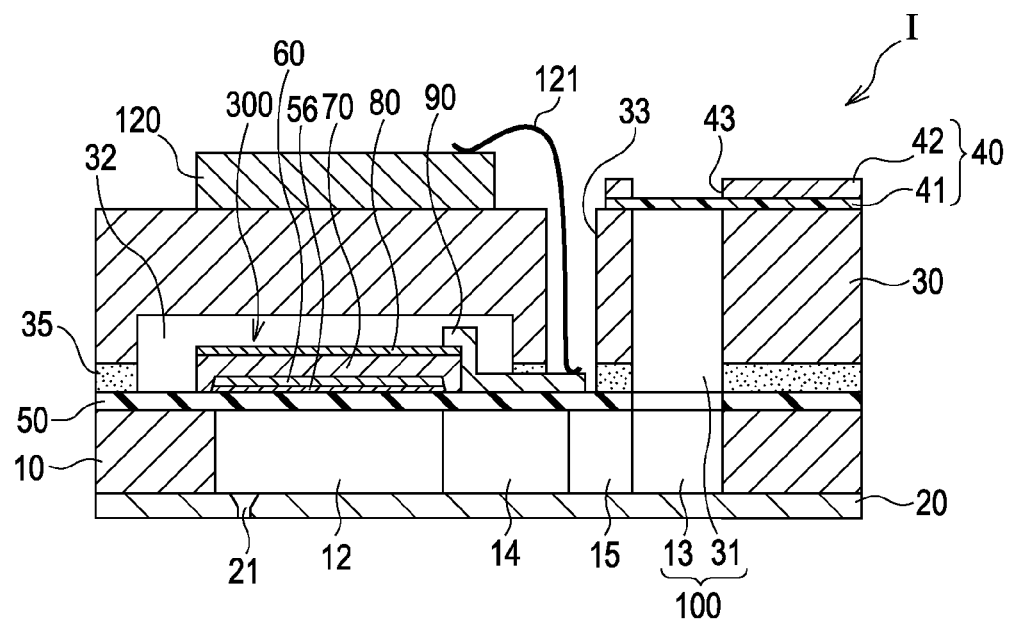
FIGS. 3A and 3B are a sectional view and a partial enlarged view, respectively, of the recording head according to the first embodiment.
Figure 3B:
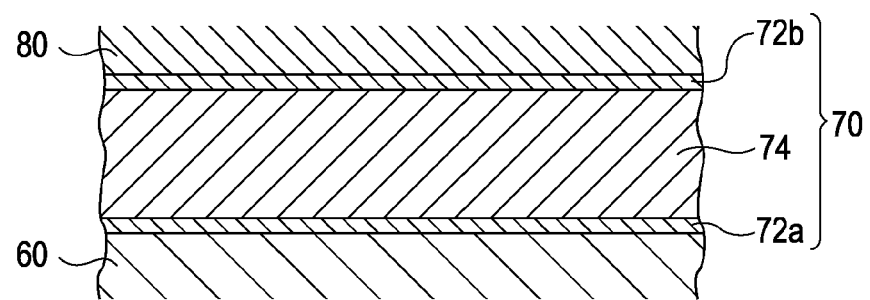

FIG. 1 is an exploded perspective view schematically showing the structure of an ink-jet recording head serving as an example of a liquid-ejecting head according to a first embodiment of the invention. FIG. 2 is a plan view of FIG. 1. FIG. 3A is a sectional view taken along line IIIA-IIIA in FIG. 2, and FIG. 3B is a partial enlarged view of FIG. 3A. As shown in FIGS. 1, 2, 3A, and 3B, a channel-forming substrate 10 used in this embodiment is a single-crystal silicon substrate, and an elastic film 50 formed of silicon dioxide is disposed on one surface thereof.

The channel-forming substrate 10 has a plurality of pressure-generating chambers 12 arranged in parallel along the width thereof. In addition, a communicating portion 13 is formed in the channel-forming substrate 10 outside the pressure-generating chambers 12 in the longitudinal direction thereof. The communicating portion 13 communicates with the pressure-generating chambers 12 through ink supply channels 14 and communicating channels 15 provided for the individual pressure-generating chambers 12. The communicating portion 13 communicates with a manifold portion 31 of a protective substrate 30, described later, to form part of a manifold 100 serving as a common ink chamber for the pressure-generating chambers 12. The ink supply channels 14 are made narrower than the pressure-generating chambers 12 so that ink flowing from the communicating portion 13 into the pressure-generating chambers 12 experiences a certain flow resistance. While the ink supply channels 14 are formed such that the channel width is reduced from one side in this embodiment, they may be formed such that the channel width is reduced from both sides. The ink supply channels 14 may also be formed such that the channel thickness, rather than the channel width, is reduced. In this embodiment, the pressure-generating chambers 12, the communicating portion 13, the ink supply channels 14, and the communicating channels 15 form a liquid channel in the channel-forming substrate 10.

A nozzle plate 20 is bonded to the orifice side of the channel-forming substrate 10 with, for example, an adhesive or a thermofusible film. The nozzle plate 20 has nozzle orifices 21 communicating with the pressure-generating chambers 12 near the ends of the pressure-generating chambers 12 facing away from the ink supply channels 14. The nozzle plate 20 is formed of, for example, glass ceramic, single-crystal silicon, or stainless steel.

The elastic film 50, as described above, is disposed on the side of the channel-forming substrate 10 opposite the orifice side. An adhesion layer 56 for improving the adhesion of first electrodes 60 to the underlying layer, such as the elastic film 50, is disposed on the elastic film 50. The adhesion layer 56 is, for example, a titanium oxide film having a thickness of about 30 to 50 nm. Optionally, an insulating film formed of, for example, zirconium oxide may be disposed on the elastic film 50.

In addition, a first electrode 60, piezoelectric layers 70 formed of a thin film having a thickness of 3 µm or less, preferably 0.3 to 1.5 µm, and second electrodes 80 are stacked on the adhesion layer 56 to form piezoelectric devices 300. The piezoelectric devices 300 refer to portions including the first electrode 60, the piezoelectric layers 70, and the second electrodes 80. In general, one of the electrodes of each piezoelectric device 300 is a common electrode, and the other electrode and the piezoelectric layer 70 are formed for each pressure-generating chamber 12 by patterning. Although the first electrode 60 serves as the common electrode of the piezoelectric devices 300 and the second electrodes 80 serve as the individual electrodes of the piezoelectric devices 300 in this embodiment, the relationship therebetween may be reversed for ease of arranging drive circuitry and wiring. The piezoelectric devices 300 and the diaphragm that is displaced as the piezoelectric devices 300 are driven are collectively referred to as actuators. Although the elastic film 50, the adhesion layer 56, the first electrode 60, and the optional insulating film serve together as a diaphragm in the example described above, it should be understood that the diaphragm is not limited thereto; for example, the elastic film 50 and the adhesion layer 56 may be omitted. Alternatively, the piezoelectric devices 300 themselves may substantially serve as diaphragms.

In this embodiment, the piezoelectric layers 70 are formed of a perovskite-type multiple oxide represented as a mixed crystal containing bismuth manganate ferrate and barium titanate. The perovskite structure, having the formula $ABO_3$, has twelve oxygen atoms coordinated to the A-site and six oxygen atoms coordinated to the B-site to form an octahedron. Bismuth and barium atoms are located at the A-site, whereas iron, manganese, and titanium atoms are located at the B-site. Specifically, as discussed in, for example, JP-A-2009-252789, a multiple oxide represented as a mixed crystal of bismuth manganate ferrate and barium titanate, that is, a multiple oxide represented as a solid solution in which bismuth manganate ferrate and barium titanate are homogeneously dissolved together, is known as a piezoelectric material. The piezoelectric layers 70 mainly contain such a multiple oxide. In the multiple oxide, bismuth manganate ferrate and barium titanate are not detected alone in an X-ray diffraction pattern.

In this embodiment, as shown in FIG. 3B, each piezoelectric layer 70 includes a first piezoelectric layer 74 and second piezoelectric layers 72a and 72b. In this embodiment, as shown in FIG. 3B, the second piezoelectric layer 72a is disposed between the first piezoelectric layer 74 and the first electrode 60, and the second piezoelectric layer 72b is disposed between the first piezoelectric layer 74 and the second electrode 80.

As described above, the first piezoelectric layer 74 and the second piezoelectric layers 72a and 72b, which form the piezoelectric layer 70, are both formed of a perovskite-type multiple oxide represented as a mixed crystal containing bismuth manganate ferrate and barium titanate, although the barium titanate content of the second piezoelectric layers 72a and 72b is at least 10 mole percent higher than the barium titanate content of the first piezoelectric layer 74. In this embodiment, the second piezoelectric layer 72a, disposed between the first piezoelectric layer 74 and the first electrode 60, and the second piezoelectric layer 72b, disposed between the first piezoelectric layer 74 and the second electrode 80, have the same composition, although they may have different compositions. For example, the barium titanate content may differ between the second piezoelectric layers 72a and 72b, or the multiple oxide forming one second piezoelectric layer may contain a larger number of A-site bismuth atoms than the multiple oxide forming the other second piezoelectric layer.

As above, because the piezoelectric layer 70 is formed of a multiple oxide represented as a mixed crystal containing bismuth manganate ferrate and barium titanate and includes the first piezoelectric layer 74 and the second piezoelectric layers 72a and 72b, which are disposed between the first piezoelectric layer 74 and the first and second electrodes 60 and 80, respectively, and whose barium titanate content is at least 10 mole percent higher than the barium titanate content of the first piezoelectric layer 74, the piezoelectric layer 70 allows a lower leakage current to flow than one including no second piezoelectric layer, as demonstrated in the examples described later. Thus, a highly reliable ink-jet recording head is provided.

The upper limit of the barium titanate content of the second piezoelectric layers 72a and 72b is not specified as long as it is at least 10 mole percent higher than the barium titanate content of the first piezoelectric layer 74. However, if the composition of the multiple oxide forming the first piezoelectric layer 74 differs largely from that of the multiple oxide forming the second piezoelectric layers 72a and 72b, a smaller strain is induced in the piezoelectric layer 70 as a whole. The composition of the second piezoelectric layers 72a and 72b may therefore be determined depending on the desired strain.

In the piezoelectric layer 70, for example, the first piezoelectric layer 74 is formed of a multiple oxide represented as a mixed crystal having formula (1), and the second piezoelectric layers 72a and 72b are formed of a multiple oxide represented as a mixed crystal having formula (2):

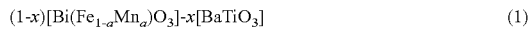

$(1-x)[Bi(Fe_{1-a}Mn_a)O_3]-x[BaTiO_3]$     (1)

(wherein $0<x<0.40$ and $0.01<a<0.10$)

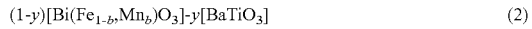

$(1-y)[Bi(Fe_{1-b}Mn_b)O_3]-y[BaTiO_3]$     (2)

(wherein $x+0.10 \leq y<1$ and $0.01<b<0.10$)
In formulas (1) and (2), a and b are preferably equal or close to each other.

The thickness of the second piezoelectric layers 72a and 72b is preferably, but not limited to, 100 nm or more. If the thickness of the second piezoelectric layers 72a and 72b is 100 nm or more, the piezoelectric layer 70 allows a lower leakage current to flow and has a higher breakdown voltage. The upper limit of the thickness of the second piezoelectric layers 72a and 72b is not specified. However, if the thickness of the second piezoelectric layers 72a and 72b is excessively large relative to that of the first piezoelectric layer 74, a smaller strain is induced in the piezoelectric layer 70 as a whole. The thickness of the second piezoelectric layers 72a and 72b may therefore be determined depending on the desired strain.

Although in this embodiment the second piezoelectric layer 72a is disposed between the first piezoelectric layer 74 and the first electrode 60 and the second piezoelectric layer 72b is disposed between the first piezoelectric layer 74 and the second electrode 80, a second piezoelectric layer may be disposed between the first electrode 60 and the first piezoelectric layer 74 and/or between the second electrode 80 and the first piezoelectric layer 74. It is preferable, however, to dispose the two second piezoelectric layers 72a and 72b between the first electrode 60 and the first piezoelectric layer 74 and between the second electrode 80 and the first piezoelectric layer 74 because they allow a lower leakage current to flow than a single second piezoelectric layer disposed at the interface between one electrode and the first piezoelectric layer 74.

The second electrodes 80, serving as the individual electrodes of the piezoelectric devices 300, are connected to leads 90, for example, gold (Au) leads, extending from near the ends of the ink supply channels 14 across the elastic film 50 or the optional insulating film.

The protective substrate 30, which has the manifold portion 31 forming at least part of the manifold 100, is bonded over the channel-forming substrate 10 having the piezoelectric devices 300 formed thereon, that is, over the first electrode 60, the elastic film 50, the optional insulating film, and the leads 90, with an adhesive 35. In this embodiment, the manifold portion 31 is formed in the width direction of the pressure-generating chambers 12 so as to extend through the protective substrate 30 across the thickness thereof and, as described above, communicates with the communicating portion 13 of the channel-forming substrate 10 to form the manifold 100, which serves as a common ink chamber for the pressure-generating chambers 12. Alternatively, the communicating portion 13 of the channel-forming substrate 10 may be divided for the individual pressure-generating chambers 12, with the manifold portion 31 alone serving as a manifold. It is also possible to, for example, form only the pressure-generating chambers 12 in the channel-forming substrate 10 and form the ink supply channels 14, through which the manifold 100 communicates with the pressure-generating chambers 12, in the members disposed between the channel-forming substrate 10 and the protective substrate 30 (such as the elastic film 50 and the optional insulating film).

The protective substrate 30 has piezoelectric-device accommodating portions 32 in regions opposite the piezoelectric devices 300 such that they form spaces large enough not to obstruct the movement of the piezoelectric devices 300. The piezoelectric-device accommodating portions 32 may be sealed or unsealed as long as they form spaces large enough not to obstruct the movement of the piezoelectric devices 300.

The protective substrate 30 is preferably formed of a material, such as glass or ceramic, having substantially the same thermal expansion coefficient as the channel-forming substrate 10. In this embodiment, the protective substrate 30 is formed of the same material as the channel-forming substrate 10, namely, single-crystal silicon.

The protective substrate 30 has a through-hole 33 extending through the protective substrate 30 across the thickness thereof. The ends of the leads 90 extending from the piezoelectric devices 300 are exposed in the through-hole 33.

A drive circuit 120 for driving the piezoelectric devices 300 arranged in parallel is mounted on the protective substrate 30. The drive circuit 120 used may be, for example, a circuit substrate or a semiconductor integrated circuit (IC). The drive circuit 120 is electrically connected to the leads 90 through conductive connection wires 121 such as bonding wires.

A compliant substrates 40 including a sealing film 41 and a securing plate 42 is bonded to the protective substrate 30. The sealing film 41 is formed of a flexible material with low rigidity and seals off one side of the manifold portion 31. The securing plate 42, on the other hand, is formed of a relatively hard material. The securing plate 42 has an opening 43 extending through the securing plate 42 across the thickness thereof in a region opposite the manifold 100. Thus, one side of the manifold 100 is sealed off by the flexible sealing film 41 alone.

The thus-configured ink-jet recording head I according to this embodiment is supplied with ink from an ink inlet connected to an external ink supply unit (not shown) until the ink fills the inner space, from the manifold 100 to the nozzle orifices 21. Subsequently, based on a recording signal from the drive circuit 120, a voltage is applied across the first electrode 60 and the second electrodes 80 corresponding to the pressure-generating chambers 12 to cause flexural deformation of the elastic film 50, the adhesion layer 56, the first electrode 60, and the piezoelectric layers 70. The deformation increases the inner pressures of the pressure-generating chambers 12, thus ejecting ink droplets from the nozzle orifices 21.

Next, an example of a method for manufacturing the ink-jet recording head I according to this embodiment will be described with reference to FIGS. 4A and 4B, 5A to 5C, 6A to 6C, 7A to 7C, and 8A and 8B, which are longitudinal sectional views of each pressure-generating chamber 12.

Figure 4A:
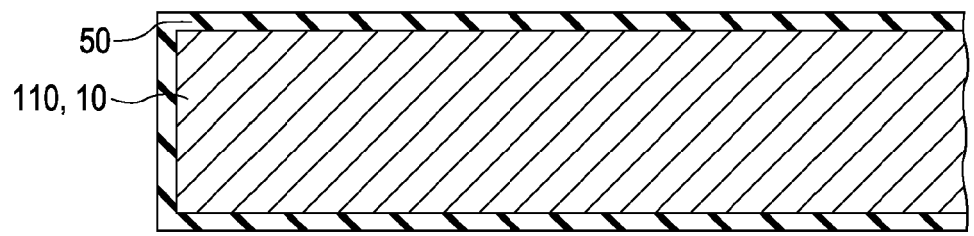
FIGS. 4A and 4B are sectional views illustrating a process of manufacturing the recording head according to the first embodiment.
Figure 4B:
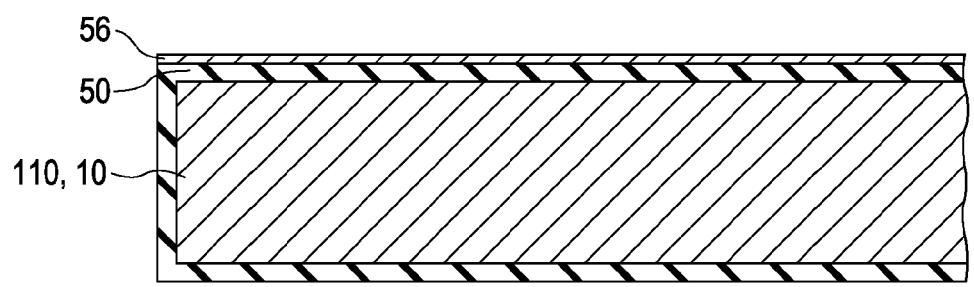

Referring first to FIG. 4A, the elastic film 50, such as a silicon dioxide ($SiO_2$) film, is formed on a channel-forming substrate wafer 110, which is a silicon wafer, for example, by thermal oxidation. Turning to FIG. 4B, the adhesion layer 56, such as a titanium oxide film, is formed on the elastic film 50 (silicon dioxide film), for example, by sputtering or thermal oxidation.

Figure 5A:
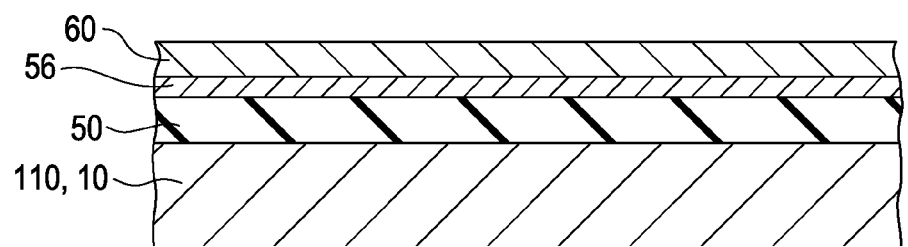
FIGS. 5A to 5C are sectional views illustrating the process of manufacturing the recording head according to the first embodiment.

Turning to FIG. 5A, the first electrode 60, such as a platinum, iridium, or iridium oxide film or a layered structure thereof, is formed over the entire adhesion layer 56, for example, by sputtering or evaporation.

The piezoelectric layer 70 is then formed on the first electrode 60. The piezoelectric layer 70 may be formed by any method, for example, by a chemical solution deposition process, such as metal-organic decomposition (MOD) or the sol-gel process, in which a metal oxide piezoelectric layer (piezoelectric film) is formed by applying and drying a solution containing a metal complex and firing the coating at high temperature. The piezoelectric layer 70 can also be formed by other processes, including both liquid-phase processes and solid-phase processes, such as laser ablation, sputtering, pulse laser deposition (PLD), chemical vapor deposition (CVD), and aerosol deposition.

The specific procedure for forming the piezoelectric layer 70 by a chemical solution deposition process is as follows. First, compositions (precursor solutions) for forming the first piezoelectric layer 74 and the second piezoelectric layers 72a and 72b are prepared. The precursor solutions, such as MOD solutions or sols, contain metal complexes, specifically, metal complexes respectively containing bismuth, iron, manganese, barium, and titanium.

The precursor solutions for forming the first piezoelectric layer 74 and the second piezoelectric layers 72a and 72b are prepared by mixing metal complexes that can form a multiple oxide containing bismuth, iron, manganese, barium, and titanium when fired and then dissolving or dispersing the mixture in an organic solvent. The mixing ratio of the metal complexes respectively containing bismuth, iron, manganese, barium, and titanium is adjusted to the ratio with which the desired perovskite-type multiple oxide, represented as a mixed crystal containing bismuth manganate ferrate and barium titanate, can be formed. As described above, the barium titanate content of the perovskite-type multiple oxide, represented as a mixed crystal containing bismuth manganate ferrate and barium titanate, that forms the second piezoelectric layers 72a and 72b needs to be at least 10 mole percent higher than the barium titanate content of the perovskite-type multiple oxide, represented as a mixed crystal containing bismuth manganate ferrate and barium titanate, that forms the first piezoelectric layer 74.

The metal complexes respectively containing bismuth, iron, manganese, barium, and titanium may be, for example, alkoxides, organic acid salts, or β-diketone complexes. Examples of metal complexes containing bismuth include bismuth 2-ethylhexanoate and bismuth acetate. Examples of metal complexes containing iron include iron 2-ethylhexanoate and iron acetate. Examples of metal complexes containing manganese include manganese 2-ethylhexanoate and manganese acetate. Examples of metal complexes containing barium include barium isopropoxide, barium 2-ethylhexanoate, and barium acetylacetonate. Examples of metal complexes containing titanium include titanium isopropoxide, titanium 2-ethylhexanoate, titanium diisopropoxide bis (acetylacetonate). Metal complexes containing two or more of bismuth, iron, manganese, barium, and titanium may also be used.

Figure 5B:
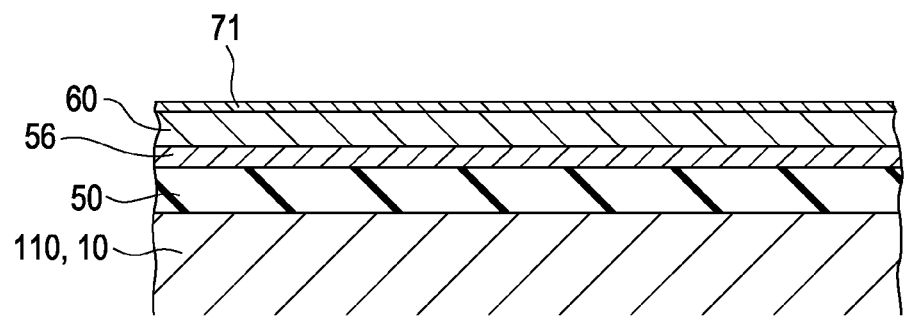

Referring to FIG. 5B, the precursor solution for forming the second piezoelectric layers 72a and 72b is applied onto the first electrode 60 by, for example, spin coating to form a second piezoelectric layer precursor film (coating step).

The second piezoelectric layer precursor film 71 is then heated to a predetermined temperature (for example, 150° C. to 200° C.) and is dried for a predetermined period of time (drying step). The dried second piezoelectric layer precursor film 71 is then debound by heating it to a predetermined temperature (for example, 350° C. to 450° C.) and maintaining it at that temperature for a predetermined period of time (debinding step). As used therein, the term "debinding" refers to removing the organic component from the second piezoelectric layer precursor film 71 as, for example, $NO_2$, $CO_2$, or $H_2O$. The drying and debinding steps may be carried out in any atmosphere, such as air, an oxygen atmosphere, or an inert gas. The coating, drying, and debinding steps may be carried out multiple times.

Figure 5C:
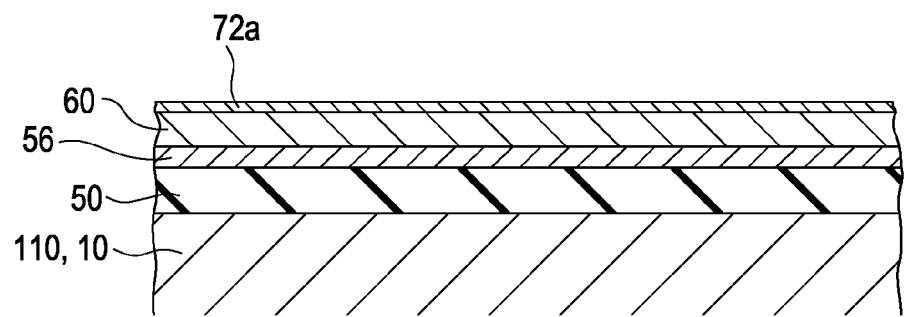

Turning to FIG. 5C, the second piezoelectric layer precursor film 71 is crystallized by heating it to a predetermined temperature, for example, about 600° C. to 850° C., and maintaining it at that temperature for a predetermined period of time, for example, one to ten minutes, to form the second piezoelectric layer 72a, which is formed of a perovskite-type multiple oxide represented as a mixed crystal containing bismuth manganate ferrate and barium titanate, on the first electrode 60 (firing step). The firing step may be carried out in any atmosphere, such as air, an oxygen atmosphere, or an inert gas. Although the second piezoelectric layer 72a is composed of a single layer in FIGS. 5A to 5C, a second piezoelectric layer 72a composed of a plurality of layers may be formed by carrying out the coating, drying, and debinding steps, or the coating, drying, debinding, and firing steps, multiple times depending on, for example, the desired thickness.

Examples of heating apparatuses used for the drying, debinding, and firing steps include rapid thermal annealing (RTA) apparatuses, which perform heating by irradiation with an infrared lamp, and hotplates.

Figure 6A:
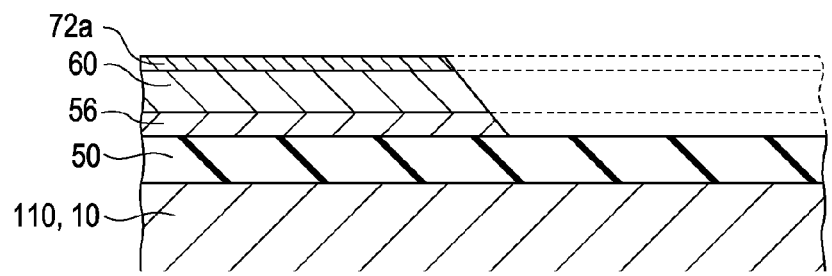
FIGS. 6A to 6C are sectional views illustrating the process of manufacturing the recording head according to the first embodiment.

Turning to FIG. 6A, the adhesion layer 56, the first electrode 60, and the second piezoelectric layer 72a are simultaneously patterned through a resist mask (not shown) formed in a predetermined pattern on the second piezoelectric layer 72a such that they have inclined side surfaces.

After the resist is removed, the precursor solution for forming the first piezoelectric layer 74 is applied onto the second piezoelectric layer 72a by, for example, spin coating to form a first piezoelectric layer precursor film (coating step).

The first piezoelectric layer precursor film is then heated to a predetermined temperature (for example, 150° C. to 200° C.) and is dried for a predetermined period of time (drying step). The dried first piezoelectric layer precursor film is then debound by heating it to a predetermined temperature (for example, 350° C. to 450° C.) and maintaining it at that temperature for a predetermined period of time (debinding step). The drying and debinding steps may be carried out in any atmosphere, such as air, an oxygen atmosphere, or an inert gas. The coating, drying, and debinding steps may be carried out multiple times.

The first piezoelectric layer precursor film is then crystallized by heating it to a predetermined temperature, for example, about 600° C. to 850° C., and maintaining it at that temperature for a predetermined period of time, for example, one to ten minute, to form a first piezoelectric film 73, which is formed of a perovskite-type multiple oxide represented as a mixed crystal containing bismuth manganate ferrate and barium titanate, on the second piezoelectric layer 72 (firing step). The firing step may be carried out in any atmosphere, such as air, an oxygen atmosphere, or an inert gas.

Figure 6B:
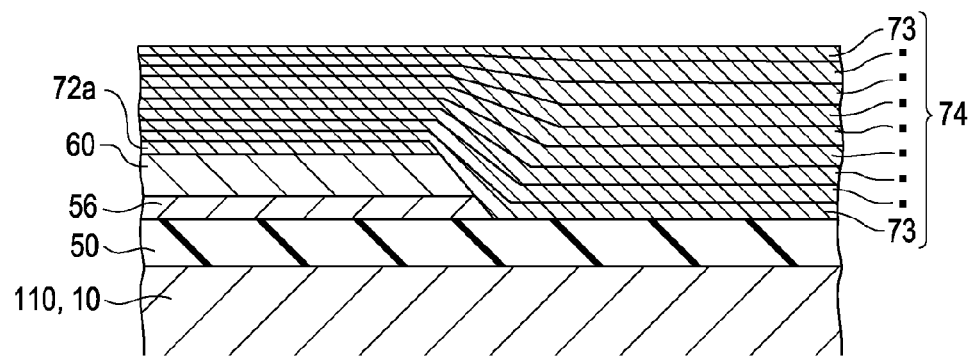
Figure 6C:
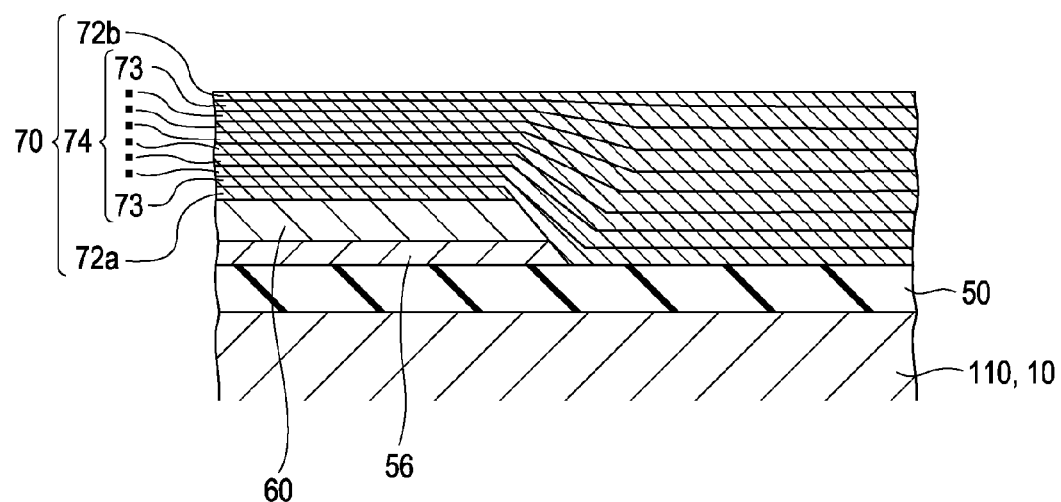

In this embodiment, a plurality of first piezoelectric films 73 are formed by carrying out the coating, drying, and debinding steps, or the coating, drying, debinding, and firing steps, multiple times depending on, for example, the desired thickness to form the first piezoelectric layer 74. As a result, as shown in FIG. 6B, a first piezoelectric layer 74 of predetermined thickness composed of a plurality of first piezoelectric films 73 is formed on the second piezoelectric layer 72a. Although the first piezoelectric layer 74 is formed by stacking a plurality of first piezoelectric films 73 in this embodiment, it may be composed of a single layer.

Next, the precursor solution for forming the second piezoelectric layer 72b was used to form the second piezoelectric layer 72b on the first piezoelectric layer 74 using by the same method used for forming the second piezoelectric layer 72a on the first electrode 60. In this embodiment, the second piezoelectric layer 72a, disposed between the first piezoelectric layer 74 and the first electrode 60, and the second piezoelectric layer 72b, disposed between the first piezoelectric layer 74 and the second electrode 80, are formed using the same precursor solution and therefore have the same composition, although they may be formed using different compositions.

Thus, the first piezoelectric layer 74, the second piezoelectric layer 72a, disposed between the first piezoelectric layer 74 and the first electrode 60, and the second piezoelectric layer 72b, disposed between the first piezoelectric layer 74 and the second electrode 80, form the piezoelectric layer 70. As above, because the piezoelectric layer 70 is formed of a multiple oxide represented as a mixed crystal containing bismuth manganate ferrate and barium titanate and includes the first piezoelectric layer 74 and the second piezoelectric layers 72a and 72b, which are disposed between the first piezoelectric layer 74 and the first and second electrodes 60 and 80, respectively, and whose barium titanate content is at least 10 mole percent higher than the barium titanate content of the first piezoelectric layer 74, the piezoelectric layer 70 allows a lower leakage current to flow.

Figure 7A:
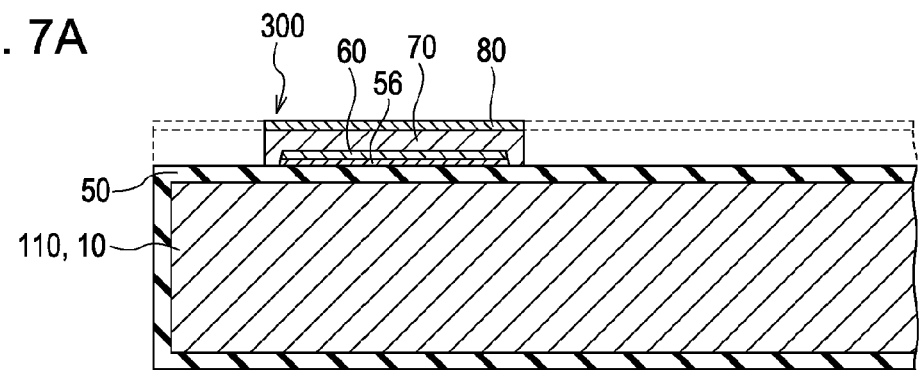
FIGS. 7A to 7C are sectional views illustrating the process of manufacturing the recording head according to the first embodiment.

After the piezoelectric layer 70 is formed in this way, as shown in FIG. 7A, the second electrode 80, such as a platinum electrode, is formed on the piezoelectric layer 70 by, for example, sputtering, and the piezoelectric layer 70 and the second electrode 80 are simultaneously patterned to form the piezoelectric devices 300, which include the first electrode 60, the piezoelectric layers 70, and the second electrodes 80, in regions opposite the pressure-generating chambers 12. The piezoelectric layer 70 and the second electrode 80 can be simultaneously patterned by dry etching through a resist mask (not shown) formed in a predetermined pattern. Subsequently, the piezoelectric layers 70 and the second electrodes 80 may be optionally annealed at, for example, 600° C. to 850° C. This forms good interfaces between the piezoelectric layers 70 and the first and second electrodes 60 and 80 and also improves the crystallinity of the piezoelectric layers 70.

Figure 7B:
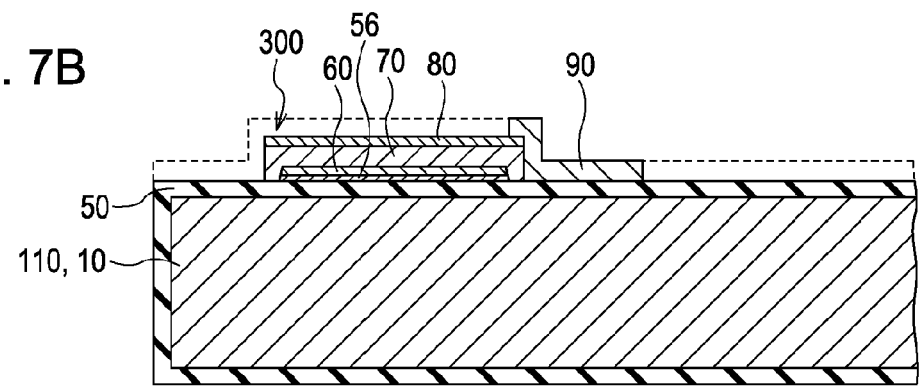

Turning to FIG. 7B, a gold (Au) film, for example, is formed over the entire channel-forming substrate wafer 110 and is patterned for the individual piezoelectric devices 300 through a mask pattern (not shown), such as a resist mask, to form the leads 90.

Figure 7C:
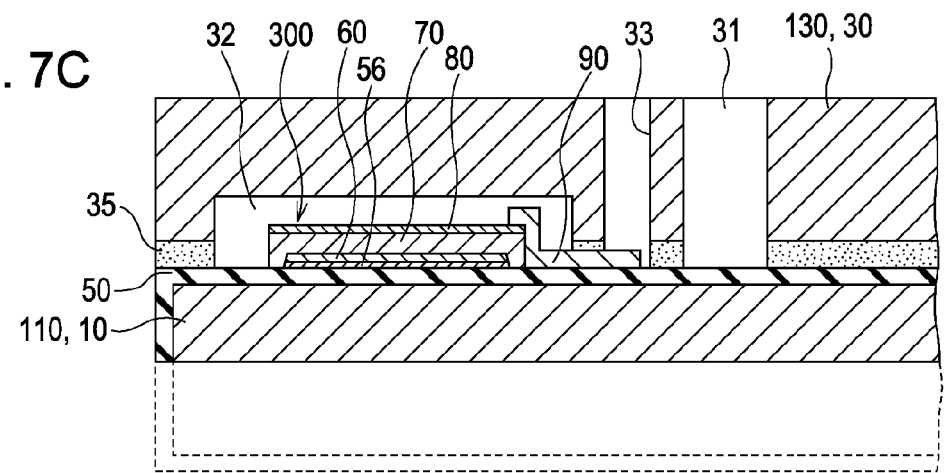

Turning to FIG. 7C, a protective substrate wafer 130 to be divided into a plurality of protective substrates 30, which is a silicon wafer, is bonded to the side of the channel-forming substrate wafer 110 on which the piezoelectric device 300 are formed with the adhesive 35, and the channel-forming substrate wafer 110 is thinned to a predetermined thickness.

Figure 8A:
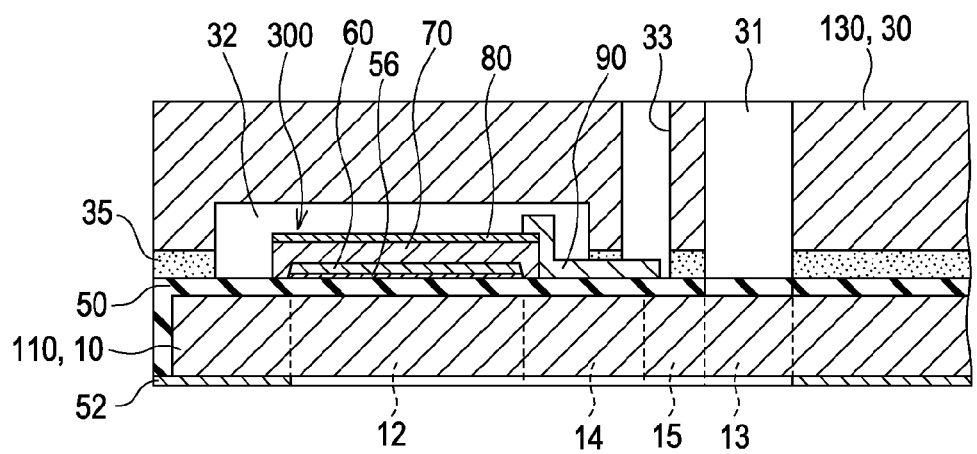
FIGS. 8A and 8B are sectional views illustrating the process of manufacturing the recording head according to the first embodiment.

Turning to FIG. 8A, a mask film 52 is newly formed on the channel-forming substrate wafer 110 and is patterned into a predetermined pattern.

Figure 8B:
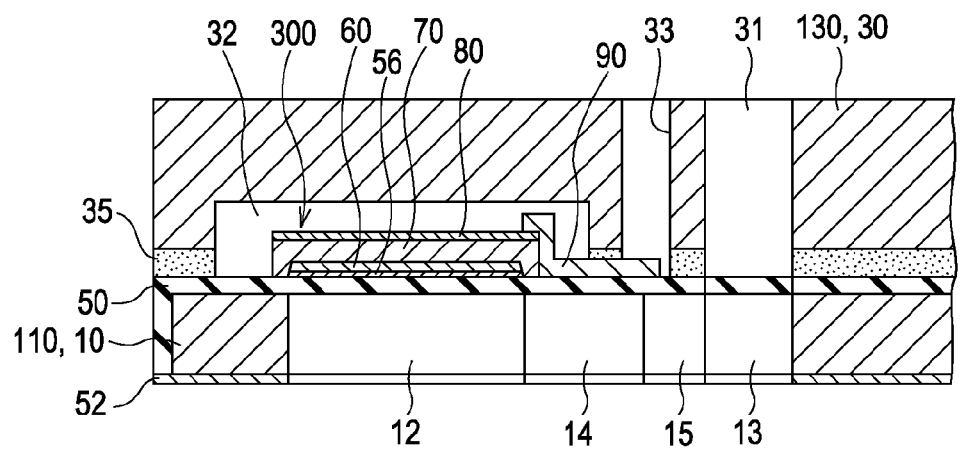

Turning to FIG. 8B, the channel-forming substrate wafer 110 is anisotropically etched with an alkali solution such as KOH (wet etching) through the mask film 52 to form the pressure-generating chambers 12 corresponding to the piezoelectric devices 300, the communicating portion 13, the ink supply channels 14, and the communicating channels 15.

Subsequently, the unnecessary marginal portions of the channel-forming substrate wafer 110 and the protective substrate wafer 130 are removed by, for example, dicing. After the mask film 52 is removed from the surface of the channel-forming substrate wafer 110 facing away from the protective substrate wafer 130, the nozzle plate 20 having the nozzle orifices 21 is bonded thereto. The compliant substrate 40 is then bonded to the protective substrate wafer 130. The channel-forming substrate wafer 110 is divided into chip-sized channel-forming substrates 10 as shown in FIG. 1. Thus, the ink-jet recording head I according to this embodiment is obtained.

EXAMPLES

The invention will be illustrated by the following examples, although the invention is not limited thereto.

Example 1

First, a silicon oxide ($SiO_2$) film was formed on a single-crystal silicon (Si) substrate by thermal oxidation. A zirconium film was then formed on the $SiO_2$ film by sputtering and was thermally oxidized to form a zirconium oxide film. A titanium oxide film having a thickness of 40 nm was then formed on the zirconium oxide film, and a platinum film (first electrode 60) oriented along the (111) plane and having a thickness of 100 nm was formed thereon by sputtering.

A piezoelectric layer 70 was then formed on the first electrode 60 by spin coating as follows. First, n-octane solutions of bismuth 2-ethylhexanoate, iron 2-ethylhexanoate, manganese 2-ethylhexanoate, barium 2-ethylhexanoate, and titanium 2-ethylhexanoate were mixed at predetermined ratios to prepare precursor solutions for forming the first piezoelectric layer 74 and the second piezoelectric layers 72a and 72b. The precursor solutions for forming the first piezoelectric layer 74 and the second piezoelectric layers 72a and 72b were prepared such that the barium titanate content of a perovskite-type multiple oxide, represented as a mixed crystal containing bismuth manganate ferrate and barium titanate, formed from the precursor solution for forming the second piezoelectric layers 72a and 72b was 10 mole percent higher than the barium titanate content of a perovskite-type multiple oxide, represented as a mixed crystal containing bismuth manganate ferrate and barium titanate, formed from the precursor solution for forming the precursor solution for forming the first piezoelectric layer 74.

The precursor solution for forming the second piezoelectric layer 72a was dropped onto the substrate on which the titanium oxide film and the platinum film were formed, and the substrate was spun at 2,500 rpm to form a second piezoelectric layer precursor film (coating step). The coating was then dried at 180° C. for three minutes (drying step) and was debound at 450° C. for three minutes (debinding step). After the process composed of the coating, drying, and debinding steps was carried out twice, the coating was fired in an RTA apparatus at 800° C. in an oxygen atmosphere for five minutes to form a second piezoelectric layer 72a having a thickness of 120 nm on the platinum film (firing step).

The precursor solution for forming the first piezoelectric layer 74 was then dropped onto the second piezoelectric layer 72a, and the substrate was spun at 2,500 rpm to form a first piezoelectric layer precursor film (coating step). The coating was then dried at 180° C. for three minutes (drying step) and was debound at 450° C. for three minutes (debinding step). After the process composed of the coating, drying, and debinding steps was carried out twice, the coating was fired in an RTA apparatus at 800° C. in an oxygen atmosphere for five minutes (firing step). The process in which the coating, drying, and debinding steps were carried out twice and then the firing step was carried out in a batch manner was carried out four times to form a first piezoelectric layer 74 having a thickness of 480 nm, where coating was carried out a total of eight times.

The precursor solution for forming the second piezoelectric layer 72b, which had the same composition used for forming the second piezoelectric layer 72a on the platinum film (first electrode 60), was dropped onto the first piezoelectric layer 74, and the substrate was spun at 2,500 rpm to form a second piezoelectric layer precursor film (coating step). The coating was then dried at 180° C. for three minutes (drying step) and was debound at 450° C. for three minutes (debinding step). After the process composed of the coating, drying, and debinding steps was carried out twice, the coating was fired in an RTA apparatus at 800° C. in an oxygen atmosphere for five minutes to form a second piezoelectric layer 72b having a thickness of 120 nm on the first piezoelectric layer 74 (firing step).

Subsequently, a platinum film (second electrode) having a thickness of 100 nm was formed as the second electrode 80 on the second piezoelectric layer 72b formed on the first piezoelectric layer 74 by sputtering and was fired in an RTA apparatus at 800° C. in an oxygen atmosphere for five minutes to form a piezoelectric device 300. The piezoelectric device 300 included a piezoelectric layer 70 formed of a perovskite-type multiple oxide represented as a mixed crystal containing bismuth manganate ferrate and barium titanate. The piezoelectric layer 70 included a first piezoelectric layer 74, a second piezoelectric layer 72a which was disposed between the first electrode 60 and the first piezoelectric layer 74 and whose barium titanate content was 10 mole percent higher than the barium titanate content of the first piezoelectric layer 74, and a second piezoelectric layer 72b which was disposed between the second electrode 80 and the first piezoelectric layer 74 and whose barium titanate content was 10 mole percent higher than the barium titanate content of the first piezoelectric layer 74. Specifically, the piezoelectric layer 70 included, in order from the first electrode 60 side, a second piezoelectric layer 72a formed of a multiple oxide represented as a mixed crystal having the formula $0.65[Bi(Fe_{0.95},Mn_{0.05})O_3]\text{-}0.35[BaTiO_3]$, a first piezoelectric layer 74 formed of a multiple oxide represented as a mixed crystal having the formula $0.75[Bi(Fe_{0.95},Mn_{0.05})O_3]\text{-}0.25[BaTiO_3]$, and a second piezoelectric layer 72b formed of a multiple oxide represented as a mixed crystal having the formula $0.65[Bi(Fe_{0.95},Mn_{0.05})O_3]\text{-}0.35[BaTiO_3]$.

Example 2

The same procedure as in Example 1 was carried out except that the process composed of the coating, drying, and debinding steps for forming the second piezoelectric layer 72a on the platinum film (first electrode 60) was carried out once to form a second piezoelectric layer 72a having a thickness of 60 nm on the platinum film (first electrode 60), that the process composed of the coating, drying, and debinding steps for forming the second piezoelectric layer 72b on the first piezoelectric layer 74 was carried out once to form a second piezoelectric layer 72b having a thickness of 60 nm on the first piezoelectric layer 74, and that the process for forming the first piezoelectric layer 74 in which the coating, drying, and debinding steps were carried out twice and then the firing step was carried out in a batch manner was carried out five times, where coating was carried out a total of ten times. The piezoelectric layer 70 included, in order from the first electrode 60 side, a second piezoelectric layer 72a formed of a multiple oxide represented as a mixed crystal having the formula $0.65[Bi(Fe_{0.95},Mn_{0.05})O_3]\text{-}0.35[BaTiO_3]$ and having a thickness of 60 nm, a first piezoelectric layer 74 formed of a multiple oxide represented as a mixed crystal having the formula $0.75[Bi(Fe_{0.95},Mn_{0.05})O_3]\text{-}0.25[BaTiO_3]$ and having a thickness of 600 nm, and a second piezoelectric layer 72b formed of a multiple oxide represented as a mixed crystal having the formula $0.65[Bi(Fe_{0.95},Mn_{0.05})O_3]\text{-}0.35[BaTiO_3]$ and having a thickness of 60 nm.

Example 3

The same procedure as in Example 1 was carried out except that the second piezoelectric layer 72b was not formed on the first piezoelectric layer 74 and that the process for forming the first piezoelectric layer 74 in which the coating, drying, and debinding steps were carried out twice and then the firing step was carried out in a batch manner was carried out five times, where coating was carried out a total of ten times. The piezoelectric layer 70 included, in order from the first electrode 60 side, a second piezoelectric layer 72a formed of a multiple oxide represented as a mixed crystal having the formula 0.65

$[Bi(Fe_{0.95},Mn_{0.05})O_3]$-$0.35[BaTiO_3]$ and having a thickness of 120 nm and a first piezoelectric layer 74 formed of a multiple oxide represented as a mixed crystal having the formula $0.75[Bi(Fe_{0.95},Mn_{0.05})O_3]$-$0.25[BaTiO_3]$ and having a thickness of 600 nm.

Comparative Example 1

The same procedure as in Example 1 was carried out except that the second piezoelectric layers 72a and 72b were not formed on the first electrode 60 and the first piezoelectric layer 74, respectively, and that the process for forming the first piezoelectric layer 74 in which the coating, drying, and debinding steps were carried out twice and then the firing step was carried out in a batch manner was carried out six times, where coating was carried out a total of twelve times. The piezoelectric layer 70 included, in order from the first electrode 60 side, a first piezoelectric layer 74 formed of a multiple oxide represented as a mixed crystal having the formula $0.75[Bi(Fe_{0.95},Mn_{0.05})O_3]$-$0.25[BaTiO_3]$ and having a thickness of 720 nm.

Test Example 1

Figure 9:
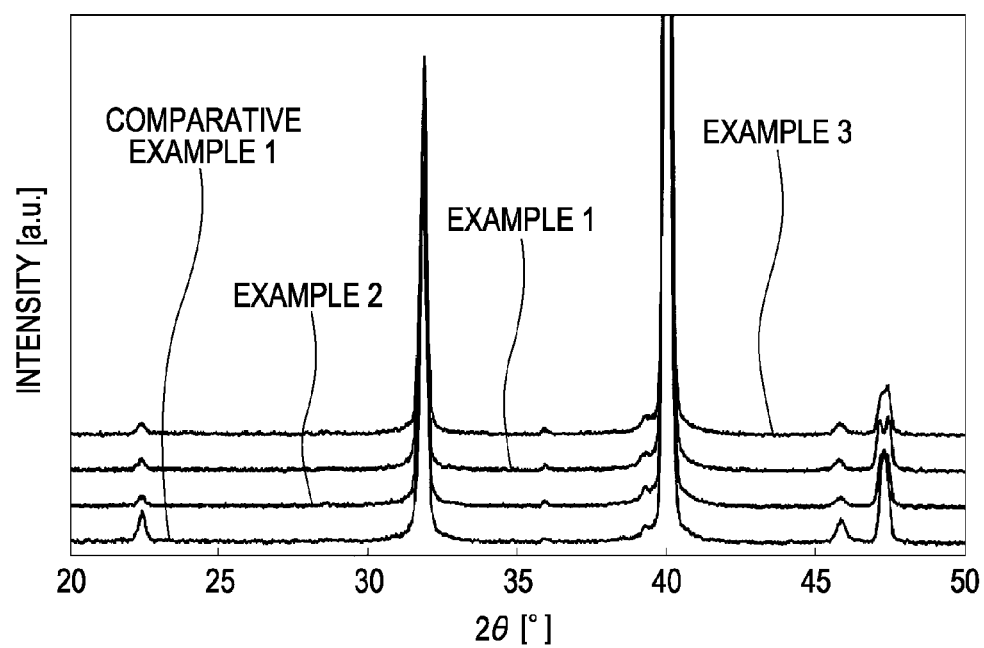
FIG. 9 is a graph showing the X-ray diffraction patterns of Examples 1 to 3 and Comparative Example 1.

The piezoelectric devices of Examples 1 to 3 and Comparative Example 1 were examined for the X-ray diffraction patterns of their piezoelectric layers 70 with "D8 Discover" from Bruker AXS using the Cu—Kα line as an X-ray source at room temperature (25° C.). The results are shown in FIG. 9. As a result, neither bismuth manganate ferrate nor barium titanate was detected alone in any of Examples 1 to 3 and Comparative Example 1. In addition, peaks derived from the perovskite structure and the substrate were found in all of Examples 1 to 3 and Comparative Example 1, and peaks derived from foreign phases such as pyrochlore phase were not found even though the thickness and position of the second piezoelectric layers 72a and 72b were varied, thus determining single-phase perovskite.

Test Example 2

The piezoelectric devices of Examples 1 to 3 and Comparative Example 1 were examined for their J-E curves using "4140B" from Hewlett-Packard Company at room temperature. Table 1 shows leak currents upon application of voltages of 20, 30, and 40 V and breakdown voltages, which are the voltages at which the piezoelectric devices broke.

As a result, as shown in Table 1, the piezoelectric devices of Examples 1 to 3, where at least one of the second piezoelectric layers 72a and 72b was formed, had lower leak currents than the piezoelectric device of Comparative Example 1, where the second piezoelectric layers 72a and 72b were not formed. In particular, the piezoelectric devices of Examples 1 and 2, where the second piezoelectric layers 72a and 72b were formed adjacent to the first electrode 60 and the second electrode 80, respectively, had especially lower leak currents. In addition, the breakdown voltages of the piezoelectric devices of Examples 1 and 3, where the second piezoelectric layers 72a and 72b had a thickness of not less than 100 nm, were comparable to that of the piezoelectric device of Comparative Example 1, demonstrating that they can be used at higher voltages without failure.

TABLE 1

| | Leak current (A/cm$^2$) | | | Breakdown |
|---|---|---|---|---|
| | 20 V | 30 V | 40 V | voltage (V) |
| Example 1 | $3.4 \times 10^{-4}$ | $3.7 \times 10^{-4}$ | $1.3 \times 10^{-3}$ | 58 |
| Example 2 | $4.0 \times 10^{-4}$ | $8.1 \times 10^{-4}$ | $1.6 \times 10^{-3}$ | 50 |
| Example 3 | $4.4 \times 10^{-4}$ | $8.5 \times 10^{-4}$ | $1.6 \times 10^{-3}$ | 58 |
| Comparative Example 1 | $4.6 \times 10^{-4}$ | $9.0 \times 10^{-4}$ | $1.7 \times 10^{-3}$ | 60 |

Other Embodiments

While an embodiment of the invention has been described above, the basic configuration of the invention is not limited thereto. For example, while the channel-forming substrate 10 illustrated in the above embodiment is a single-crystal silicon substrate, the type of channel-forming substrate is not limited thereto and may instead be, for example, a silicon-on-insulator (SOI) substrate or a glass substrate.

In addition, while the piezoelectric devices 300 illustrated in the above embodiment have the first electrode 60, the piezoelectric layers 70, and the second electrodes 80 sequentially formed on the substrate (channel-forming substrate 10), the type of piezoelectric device is not limited thereto and may instead be, for example, a longitudinally vibrating piezoelectric device in which a piezoelectric material and an electrode material are alternately deposited so that it extends and contracts axially.

Figure 10:
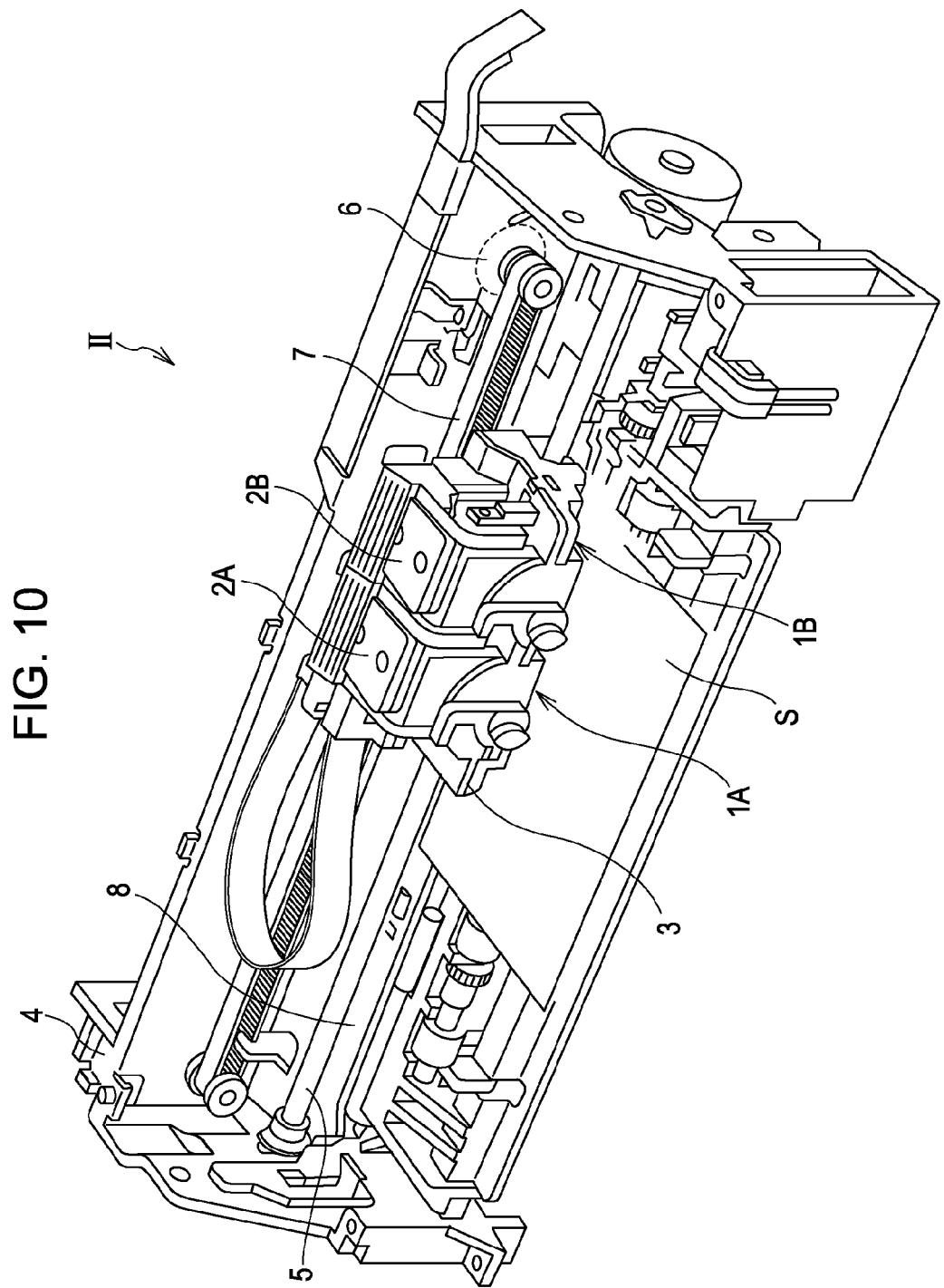
FIG. 10 is a schematic view showing the structure of a recording apparatus according to an embodiment of the invention.

In addition, the ink-jet recording heads according to the above embodiments are mounted on an ink-jet recording apparatus as a part of a recording head unit having an ink channel communicating with, for example, an ink cartridge. FIG. 10 is a schematic view of an example of an ink-jet recording apparatus.

An ink-jet recording apparatus II shown in FIG. 10 includes recording head units 1A and 1B, each including the ink-jet recording head I. The recording head units 1A and 1B have detachable cartridges 2A and 2B, respectively, which constitute ink supply units. A carriage 3 carrying the recording head units 1A and 1B is disposed on a carriage shaft 5 attached to a main body 4 so as to be movable in the axial direction. The recording head units 1A and 1B eject, for example, a black ink composition and a color ink composition, respectively.

The carriage 3 carrying the recording head units 1A and 1B is moved along the carriage shaft 5 as driving force is transmitted from a drive motor 6 to the carriage 3 via a plurality of gears (not shown) and a timing belt 7. The main body 4, on the other hand, has a platen 8 extending along the carriage shaft 5 so that a recording sheet S, which is a recording medium such as paper, fed by a feed roller (not shown) is transported over the platen 8.

While ink-jet recording heads have been described as an example of liquid-ejecting heads in the above embodiments, the invention is directed to a wide variety of liquid-ejecting heads and can also be applied to liquid-ejecting heads that eject liquids other than inks. Examples of other liquid-ejecting heads include various recording heads used for image-recording devices such as printers, colorant-ejecting heads used for manufacturing color filters of devices such as liquid crystal displays, electrode-material ejecting heads used for forming electrodes of devices such as organic electroluminescent (EL) displays and field-emission displays (FED), and biological-organic-material ejecting heads used for manufacturing biochips.

In addition, the invention is not limited to piezoelectric devices for mounting on liquid-ejecting heads such as ink-jet recording heads and can also be applied piezoelectric devices for mounting on other devices, including ultrasonic devices such as ultrasonic transmitters, ultrasonic motors, pressure sensors, and pyroelectric devices such as infrared sensors. In addition, the invention can be similarly applied to ferroelectric devices such as ferroelectric memories.

What is claimed is:

1. A piezoelectric device comprising:
   a first electrode;
   a piezoelectric layer provided above the first electrode; and
   a second electrode provided above the piezoelectric layer; wherein
   the piezoelectric layer comprises a mixed crystal containing at least bismuth ferrate and barium titanate;
   the piezoelectric layer comprises a first piezoelectric layer and a second piezoelectric layer which is disposed between at least one of the first and second electrodes and the first piezoelectric layer; and
   the barium titanate content of the second piezoelectric layer is at least 10 mole percent higher than the barium titanate content of the first piezoelectric layer.

2. The piezoelectric device according to claim 1, wherein the second piezoelectric layer is disposed between the first electrode and the first piezoelectric layer and between the second electrode and the first piezoelectric layer.

3. The piezoelectric device according to claim 1, wherein the second piezoelectric layer has a thickness of 100 nm or more.

4. A liquid-ejecting head comprising the piezoelectric device according to claim 1.

5. A liquid-ejecting apparatus comprising the liquid-ejecting head according to claim 4.

6. A piezoelectric device comprising:
   a first electrode;
   a piezoelectric layer provided above the first electrode; and
   a second electrode provided above the piezoelectric layer; wherein
   the piezoelectric layer comprises a mixed crystal containing at least bismuth ferrate and barium titanate;
   the piezoelectric layer comprises a first piezoelectric layer and a second piezoelectric layer which is disposed between at least one of the first and second electrodes and the first piezoelectric layer; and
   the barium titanate content of the second piezoelectric layer is at least 10 mole percent higher than the barium titanate content of the first piezoelectric layer,
   wherein the first piezoelectric layer contains a mixed crystal having formula (1), and the second piezoelectric layer contains a mixed crystal having formula (2):

$$(1-x)[Bi(Fe_{1-a},Mn_a)O_3]\text{-}x[BaTiO_3] \qquad (1)$$

(wherein $0<x<0.40$ and $0.01<a<0.10$)

$$(1-y)[Bi(Fe_{1-b},Mn_b)O_3]\text{-}y[BaTiO_3] \qquad (2)$$

(wherein $x+0.10 \leq y<1$ and $0.01<b<0.10$).

* * * * *